US008221962B2

(12) United States Patent
Takahashi et al.

(10) Patent No.: US 8,221,962 B2
(45) Date of Patent: Jul. 17, 2012

(54) METHOD OF MANUFACTURING ELECTRONIC DEVICE

(75) Inventors: Takeo Takahashi, Yokohama (JP); Xiaoyu Mi, Kawasaki (JP); Tsuyoshi Yokoyama, Kawasaki (JP); Satoshi Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 571 days.

(21) Appl. No.: 12/343,935

(22) Filed: Dec. 24, 2008

(65) Prior Publication Data

US 2009/0170032 A1    Jul. 2, 2009

(30) Foreign Application Priority Data

Dec. 28, 2007    (JP) ................................. 2007-340037

(51) Int. Cl.
*G03F 7/26* (2006.01)

(52) U.S. Cl. ...................................... 430/315

(58) Field of Classification Search .................. 430/314, 430/312, 319, 311
See application file for complete search history.

(56) References Cited

U.S. PATENT DOCUMENTS

| | | | |
|---|---|---|---|
| 5,370,766 A | | 12/1994 | Desaigoudar et al. |
| 5,743,998 A | * | 4/1998 | Park ........................... 216/51 |
| 5,891,606 A | * | 4/1999 | Brown ......................... 430/312 |
| 2003/0030985 A1 | * | 2/2003 | Sakai ........................... 361/720 |
| 2003/0139055 A1 | * | 7/2003 | Hasegawa et al. .............. 438/725 |
| 2004/0190217 A1 | | 9/2004 | Stokes |
| 2007/0045773 A1 | * | 3/2007 | Mi et al. ........................ 257/531 |
| 2007/0080329 A1 | * | 4/2007 | Nomiya et al. ................ 252/500 |

FOREIGN PATENT DOCUMENTS

| | | |
|---|---|---|
| JP | 04-061264 A | 2/1992 |
| JP | 06-283846 | 10/1994 |
| JP | 2002-033560 | 1/2002 |
| JP | 2004-304154 | 10/2004 |
| JP | 2006-157738 A | 6/2006 |
| JP | 2007-031242 A | 2/2007 |
| JP | 2007-067236 A | 3/2007 |
| JP | 2007-123468 A | 5/2007 |

OTHER PUBLICATIONS

Albert Sutono et al., "RF/Microwave Characterization of Multilayer Ceramic-Based MCM Technology", IEEE Transactions on Advanced Packaging, vol. 22, No. 3, Aug. 1999, pp. 326-331.
Guo Lihui et al., "High Q Multilayer Spiral Inductor on Silicon Chip for 5-6 GHz", IEEE Electron Device Letters, vol. 23, No. 8, Aug. 2002, pp. 470-472.
Office Action dated Mar. 21, 2012 in Japanese Patent Application 2007-340037.

* cited by examiner

*Primary Examiner* — Kathleen Duda
*Assistant Examiner* — Caleen Sullivan
(74) *Attorney, Agent, or Firm* — Arent Fox LLP

(57) ABSTRACT

A method of manufacturing an electronic device includes forming a photosensitive SOG oxide layer on a multi-layer ceramics substrate having a penetrating electrode, forming an opening by subjecting the photosensitive SOG oxide layer to an exposure treatment and developing treatment so that an upper face of the penetrating electrode is exposed, and forming a passive element on the photosensitive SOG oxide layer, the passive element being connected to the penetrating electrode through the opening.

5 Claims, 16 Drawing Sheets

METHOD OF MANUFACTURING ELECTRONIC DEVICE

CROSS-REFERENCE TO RELATED APPLICATION

This application is based upon and claims the benefit of priority of the prior Japanese Patent Application No. 2007-340037, filed on Dec. 28, 2007, the entire contents of which are incorporated herein by reference.

FIELD

The present invention generally relates to a method of manufacturing an electronic device, and more particularly, to a method of manufacturing an electronic device where a passive element is provided on a multi-layer ceramics substrate.

BACKGROUND

An inductor or a capacitor is used for phase matching of a high-frequency circuit. For example, there are demands for downsizing a RF (Radio Frequency) system such as a cellular phone or a wireless LAN (Local Area Network), reducing cost of the RF system, and enhancing performance of the RF system. For the same reason, downsizing, cost reduction and high performance are requested for a device mounted on the RF system. There is used an electronic device such as an integrated passive element in which a passive element is integrated.

There has been developed an integrated passive element in which a passive element is incorporated in a multi-layer ceramics substrate, with a LTCC (Low Temperature Co-filed Ceramics) technology as a method of satisfying the demands. There has been developed an integrated passive element in which a passive element is provided on a multi-layer ceramics substrate. There is, however, a problem that Q value of an inductor is reduced and a passive element having high Q value cannot be manufactured because relative permittivity of the ceramics substrate is higher than a quartz substrate.

Japanese Patent Application Publication No. 2007-123468 and Japanese Patent Application Publication No. 2007-31242 disclose an art where a coating layer is provided on a ceramics substrate and a passive element is provided on the coating layer.

A passive element such as an inductor is formed on an insulating layer having relative permittivity lower than that of a multi-layer ceramics substrate when the passive element is formed on the multi-layer ceramics substrate. This results in restraint of dielectric loss of the passive element. It is not preferable that a resin-based insulating layer such as PBO (Polybenzoxazole) or BCB (Benzocyclobutene) having low thermal resistance is used, because temperature of the multi-layer ceramics substrate is increased to a range of 200 degrees C to 300 degrees C in a manufacturing process of the passive element. It is preferable that an oxide layer having high thermal resistance is used. An opening is formed in the oxide layer in order to electrically couple a penetrating electrode and a passive element. Generally, the opening is formed in the oxide layer with a dry etching method using fluorine-based gas (for example HF, $CF_4$ or the like) or a wet etching method using a solution including hydrogen fluoride. There is, however, a problem that etching speed of the dry etching method is low. And there is a problem that ceramics of the multi-layer ceramics substrate dissolves as well as the oxide layer when an etchant including fluorine or hydrogen fluoride is used in the wet etching method. It is preferable that the oxide layer is thick for the purpose of reducing dielectric loss of the passive element. However, etching time of the dry etching method is increased when the oxide layer is thick. On the other hand, the multi-layer ceramics substrate tends to dissolve because of side etching in the wet etching method.

SUMMARY

The present invention has been made in view of the above circumstances and provides a method of manufacturing an electronic device including forming a passive element on a multi-layer ceramics substrate having a penetrating electrode, in which dissolution of the multi-layer ceramics substrate is restrained during the formation of an opening in an insulating layer and the multi-layer ceramics substrate is spaced from the passive element.

According to an aspect of the present invention, there is provided a method of manufacturing an electronic device including forming a photosensitive SOG oxide layer on a multi-layer ceramics substrate having a penetrating electrode, forming an opening by subjecting the photosensitive SOG oxide layer to an exposure treatment and developing treatment so that an upper face of the penetrating electrode is exposed, and forming a passive element on the photosensitive SOG oxide layer, the passive element being connected to the penetrating electrode through the opening. With the method, it is possible to restrain dissolution of the multi-layer ceramics substrate in a forming process of an opening with an etching method, because the opening is formed in the photosensitive SOG oxide layer with exposure and development.

BRIEF DESCRIPTION OF THE DRAWINGS

FIG. 1A illustrates a top view of the stacked ceramics substrate, and FIG. 1B illustrates a cross sectional view of the stacked ceramics;

FIG. 2A illustrates a top view of the stacked ceramics substrate, and FIG. 2B illustrates a cross sectional view of the stacked ceramics;

FIG. 3A illustrates a top view of the stacked ceramics substrate, and FIG. 3B illustrates a cross sectional view of the stacked ceramics;

FIG. 4A illustrates a top view of the stacked ceramics substrate, and FIG. 4B illustrates a cross sectional view of the stacked ceramics;

FIG. 5A illustrates a top view of the stacked ceramics substrate, and FIG. 5B illustrates a cross sectional view of the stacked ceramics;

DESCRIPTION OF EMBODIMENTS

In order to facilitate better understanding of the present invention, a description will now be given of related art.

Figure 1A:
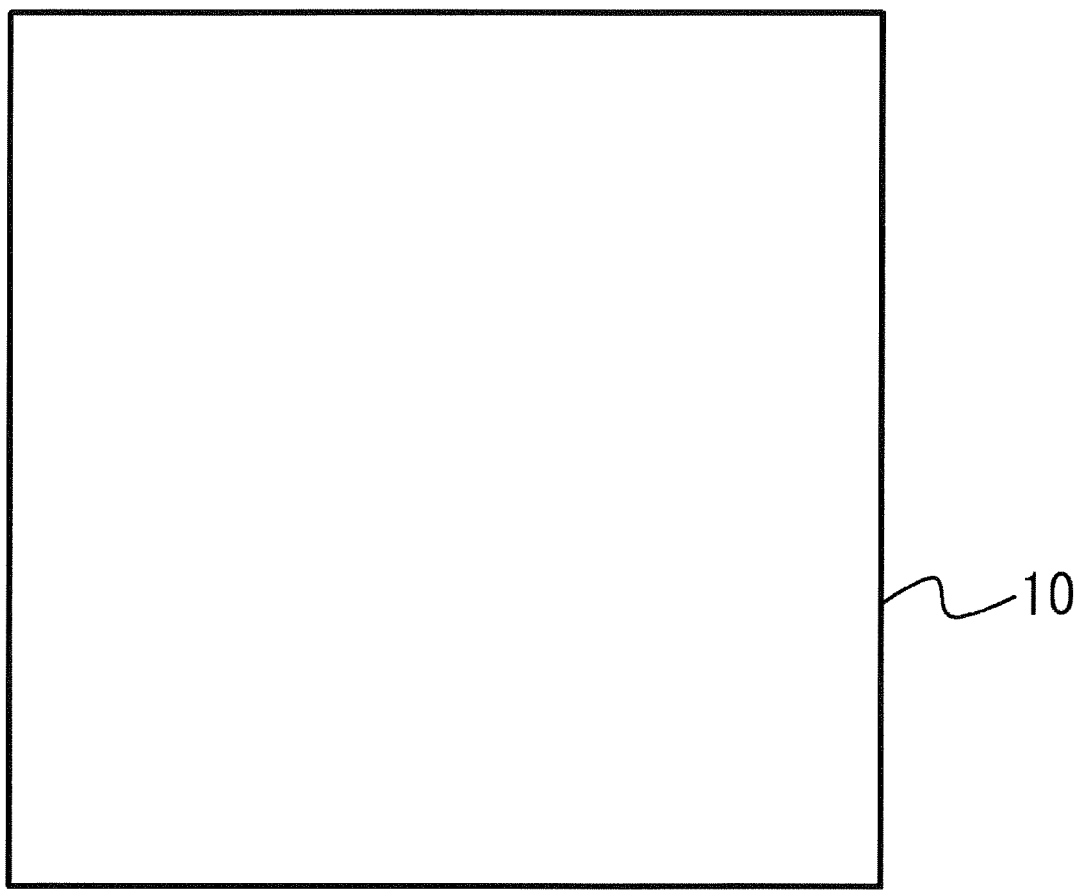
FIG. 1A and FIG. 1B illustrate a method of manufacturing a stacked ceramics substrate.
Figure 1B:
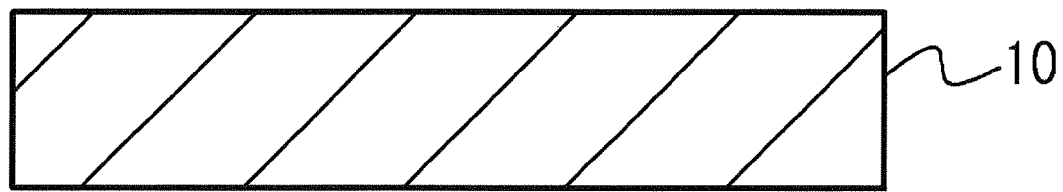
Figure 2A:
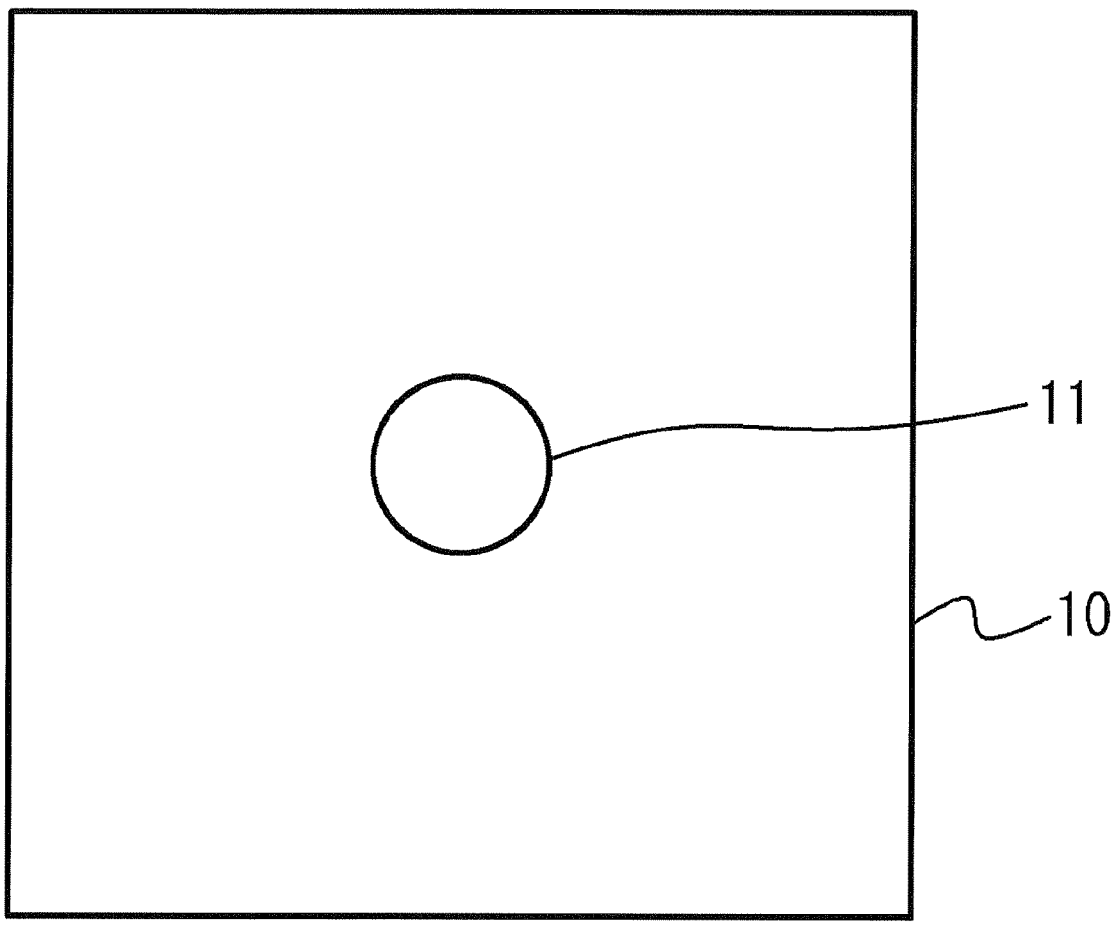
FIG. 2A and FIG. 2B illustrate the method of manufacturing the stacked ceramics substrate.
Figure 2B:
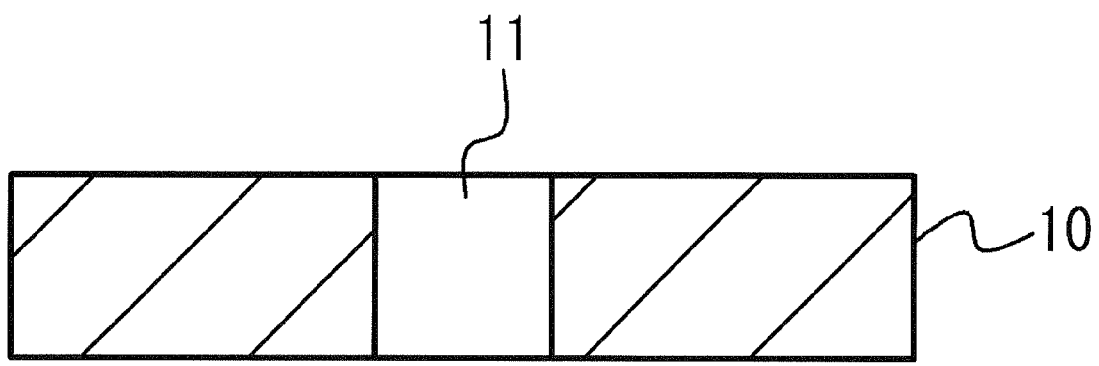
Figure 3A:
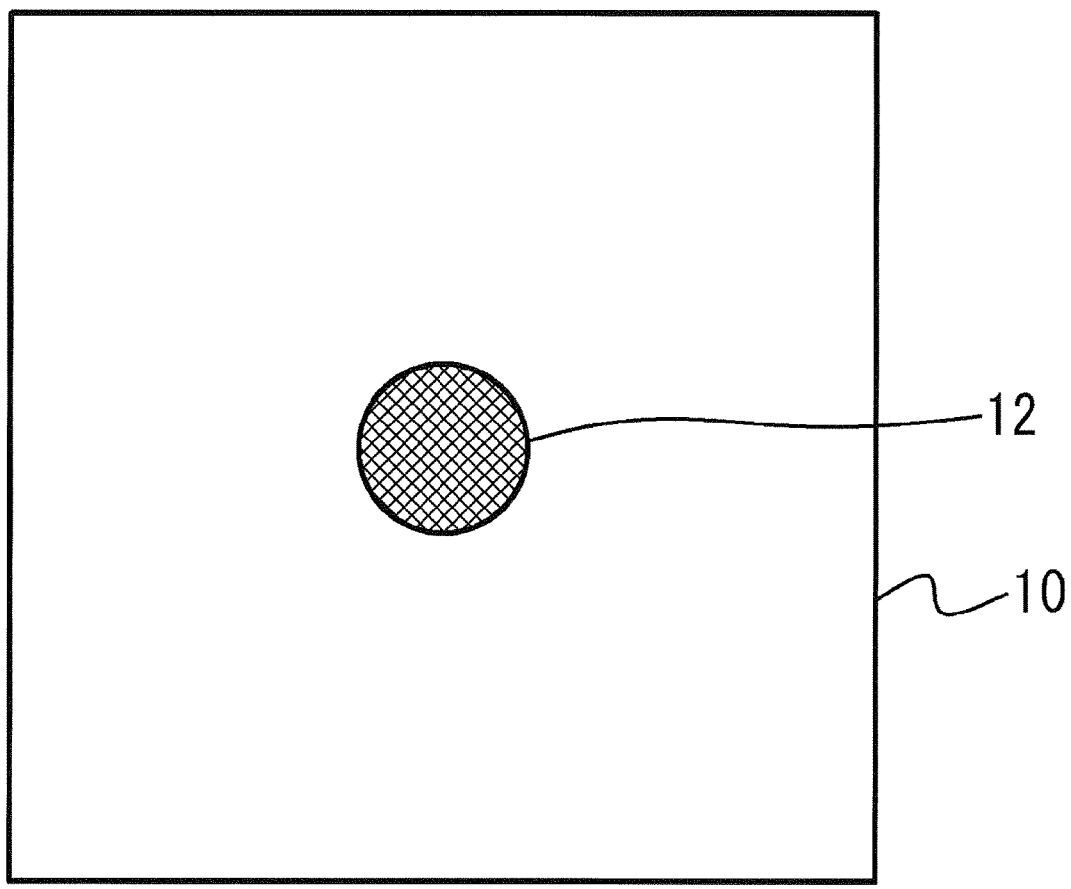
FIG. 3A and FIG. 3B illustrate the method of manufacturing the stacked ceramics substrate.
Figure 3B:
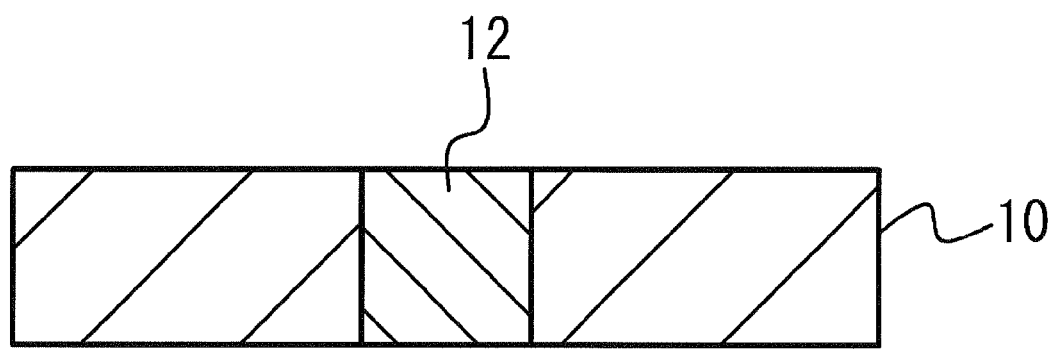
Figure 4A:
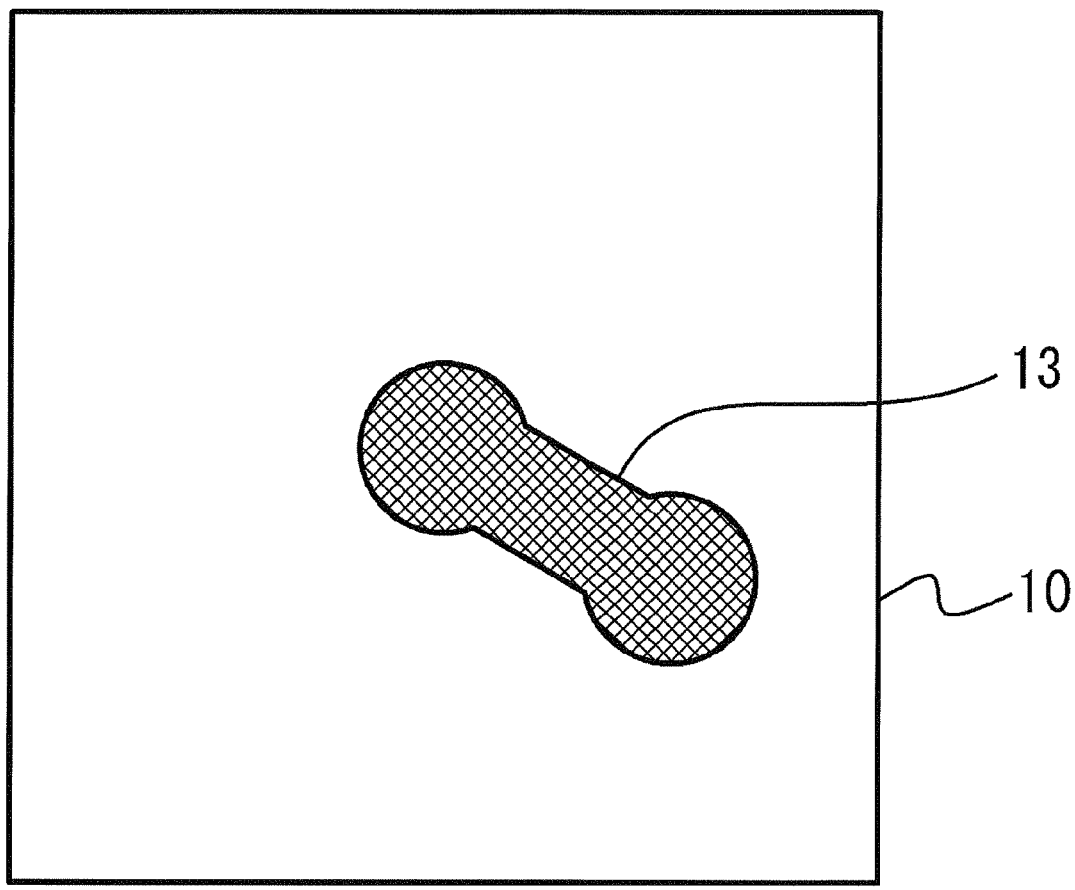
FIG. 4A and FIG. 4B illustrate the method of manufacturing the stacked ceramics substrate.
Figure 4B:
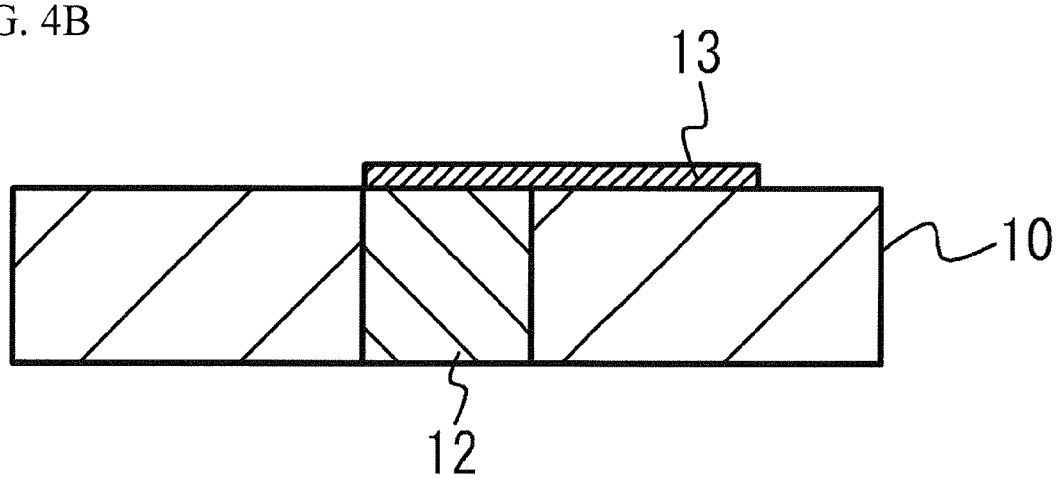
Figure 5A:
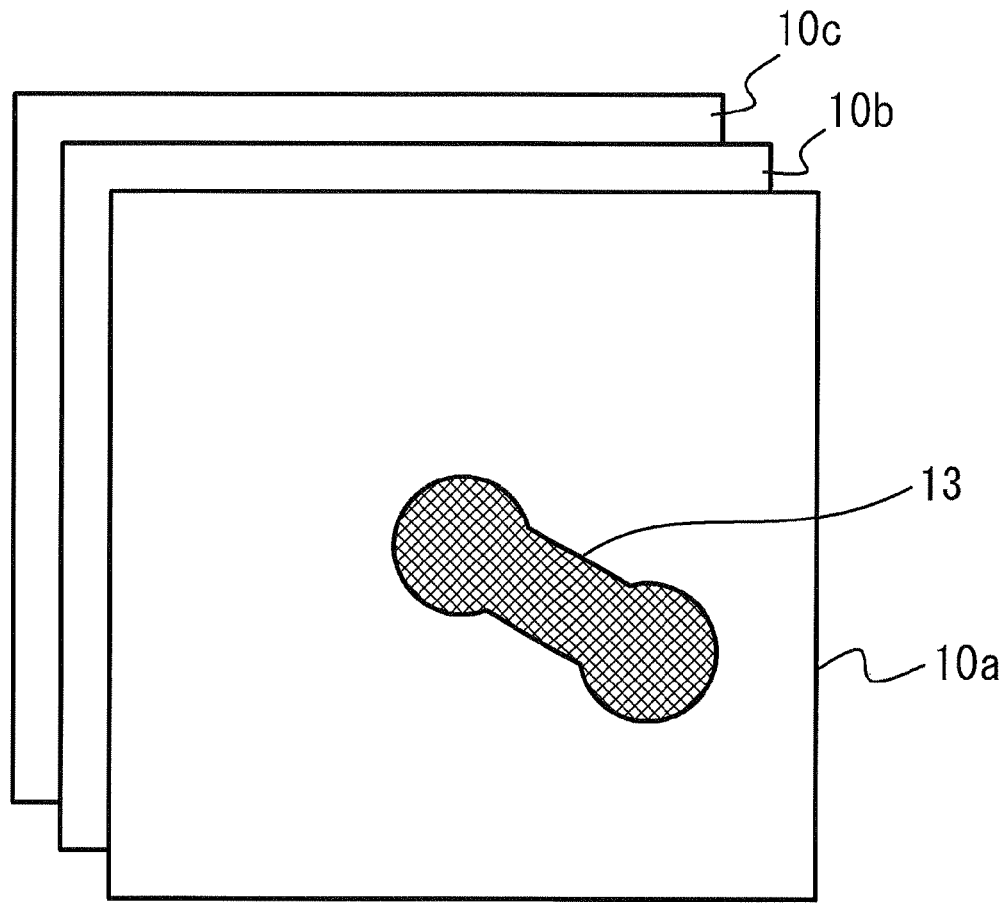
FIG. 5A and FIG. 5B illustrate the method of manufacturing the stacked ceramics substrate.
Figure 5B:
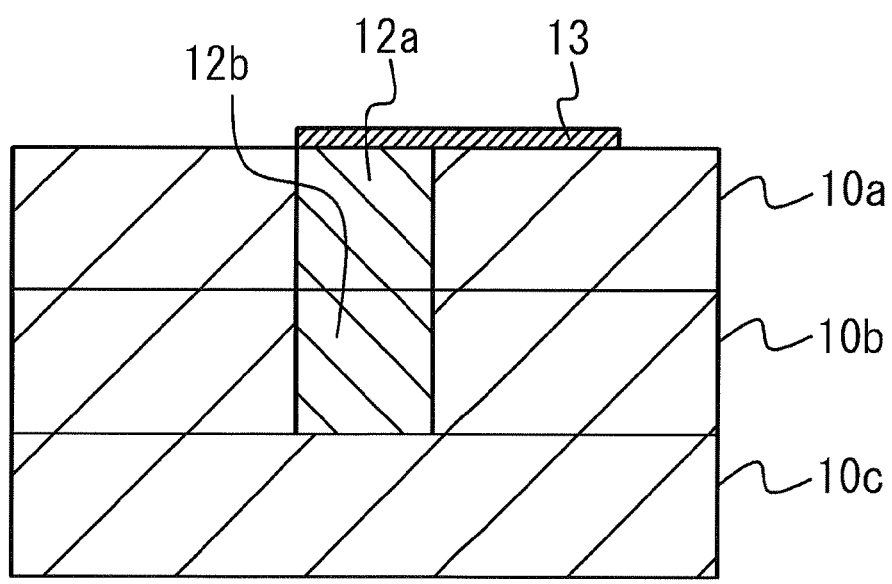

A description will be given of a method of manufacturing a multi-layer ceramics substrate with reference to FIG. 1A through FIG. 6. As illustrated in FIG. 1A and FIG. 1B, a greesheet 10 is formed and cut off into a desirable shape. The greesheet 10 is made of a metal oxide such as aluminum oxide ($Al_2O_3$), silicon oxide ($SiO_2$), titanium oxide ($TiO_2$), or calcium oxide (CaO). As illustrated in FIG. 2A and FIG. 2B, a through-hole 11 is formed in the sheet 10 by punching. As illustrated in FIG. 3A and FIG. 3B, a metal such as Ag, Au or Cu is implanted in the through-hole 11. This results in formation of a penetrating electrode 12. As illustrated in FIG. 4A and FIG. 4B, a metal interconnection 13 made of such as Ag, Au or Cu is formed on the sheet 10. As illustrated in FIG. 5A and FIG. 5B, sheets 10a through 10c made with the above-mentioned process are stacked. For example, the sheet 10a and the sheet 10b are stacked so that a penetrating electrode 12a of the sheet 10a communicates with a penetrating electrode 12b of the sheet 10b. The stacked sheets 10a through 10c may be formed into a desirable shape. For example, the sheets may be formed into a wafer shape in order that a passive element is easily formed on the sheets.

Figure 6:
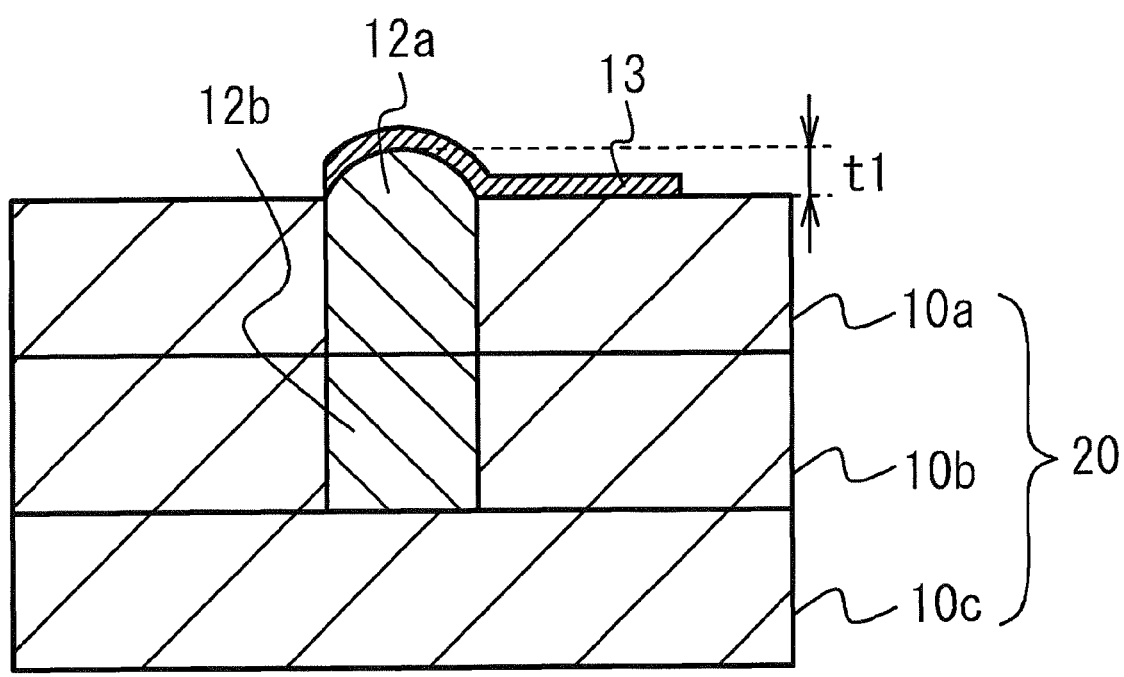
FIG. 6 illustrates the method of manufacturing the stacked ceramics substrate.

As illustrated in FIG. 6, the stacked sheets 10a through 10c are burnt. This results in a formation of a multi-layer ceramics substrate 20. A surface of the multi-layer ceramics substrate 20 is grinded with a loose grain or a fixed grain in order to adjust thickness and surface roughness of the multi-layer ceramics substrate 20 to a desirable value. An upper face of the penetrating electrode projects, because the sheets 10a through 10c contract during the burning. The penetrating electrode 12a projects further, because the sheet 10a is easily grinded and the penetrating electrode made of metal is hardly grinded during the grinding. The upper face of the penetrating electrode is therefore higher than that of the multi-layer ceramics substrate 20. A projecting amount t1 of the penetrating electrode 12a from the sheet 10a is, for example, 0.5 μm to 10 μm.

First Embodiment

Figure 7A:
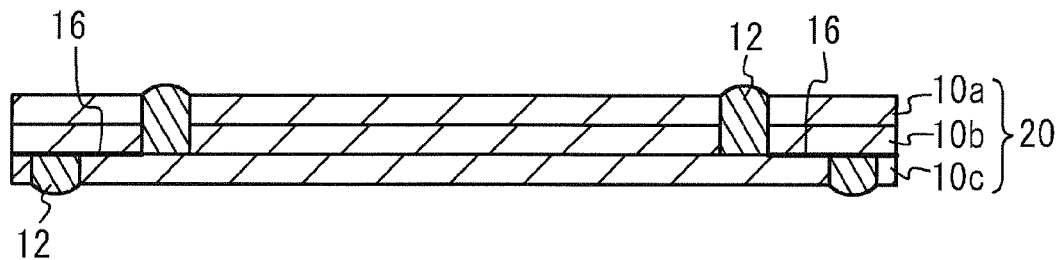
FIG. 7A through FIG. 7D illustrate a cross sectional view showing a method of manufacturing an integrated passive element in accordance with a first embodiment.

A description will be given of a method of manufacturing an integrated passive element in accordance with a first embodiment, with reference to FIG. 7A through FIG. 9D. As illustrated in FIG. 7A, the multi-layer ceramics substrate 20 is manufactured with the method explained with FIG. 1A through FIG. 6. The penetrating electrode 12 and an inner connection 16 are formed in the multi-layer ceramics substrate 20.

Figure 7B:
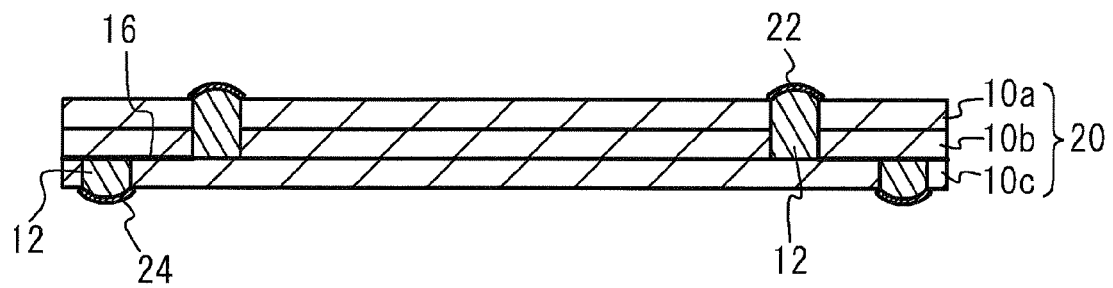

As illustrated in FIG. 7B, a protective layer 22 and a protective layer 24 are formed on the upper face of the penetrating electrode 12 with non-electrolytic plating method. The protective layers 22 and 24 are, for example, made of a Ni layer having thickness of 1 μm to 3 μm and an Au layer having thickness of 0.1 μm to 0.3 μm in order from the multi-layer ceramics substrate 20. A Pd layer having thickness of 0.1 μm to 0.3 μm may be provided between the Au layer and the Ni layer of the protective layers 22 and 24. The protective layers 22 and 24 protect the upper face of the penetrating electrode 12 and restrain a mutual diffusion of atom between a connection terminal and the penetrating electrode 12.

Figure 7C:
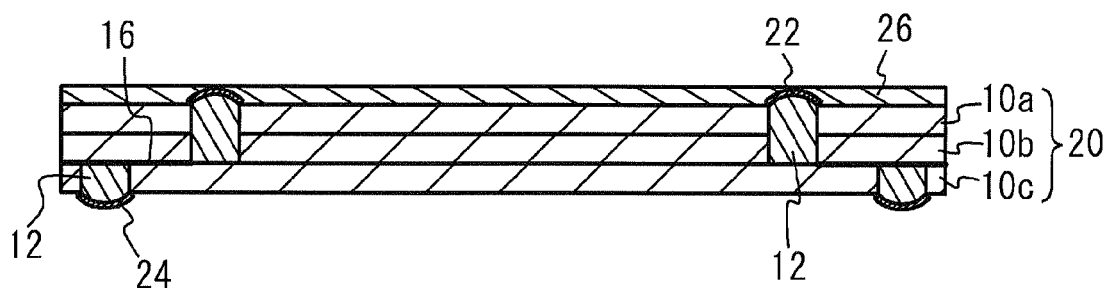
Figure 7D:
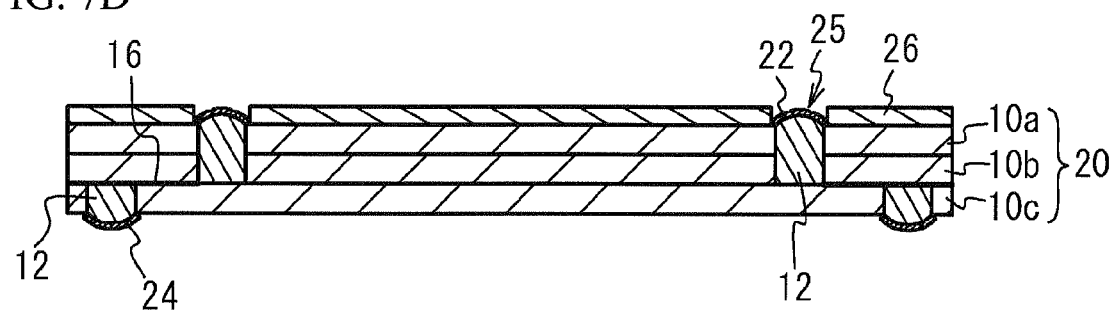

As illustrated in FIG. 7C, a photosensitive SOG (spin on glass) is spin-coated on the upper face of the multi-layer ceramics substrate 20. XC3380i made by Sliecs corporation may be used as the photosensitive SOG. A photosensitive SOG oxide layer 26 may be formed with an immersion method instead of the spin-coating method. The spin-coating may be performed more than once. The thickness of the SOG may be a desirable one. The SOG may be subjected to a thermal treatment at 120 degrees C. or the like. As illustrated in FIG. 7D, an opening 25 is formed in the photosensitive SOG oxide layer 26 so that the upper face of the penetrating electrode 12 is exposed, with exposure and development. The photosensitive SOG oxide layer 26 is subjected to a curing treatment at 250 degrees C. or the like. This results in a formation of the photosensitive SOG oxide layer 26 having the opening 25.

Figure 8A:
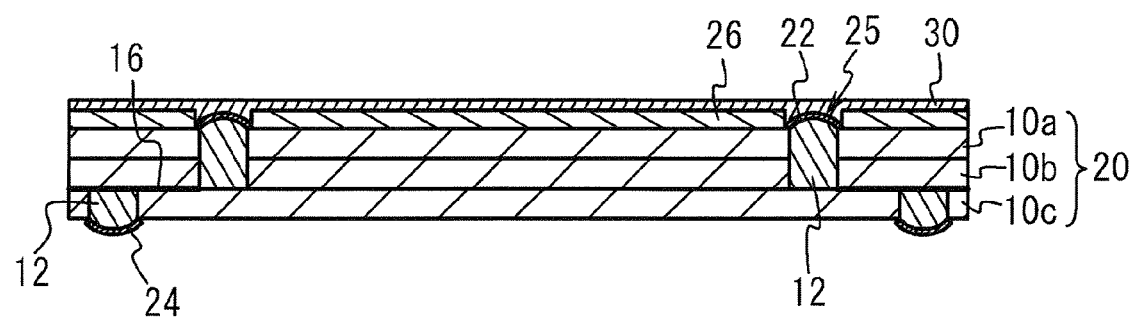
FIG. 8A and FIG. 8B illustrate a cross sectional view showing the method of manufacturing the integrated passive element in accordance with the first embodiment.
Figure 8B:
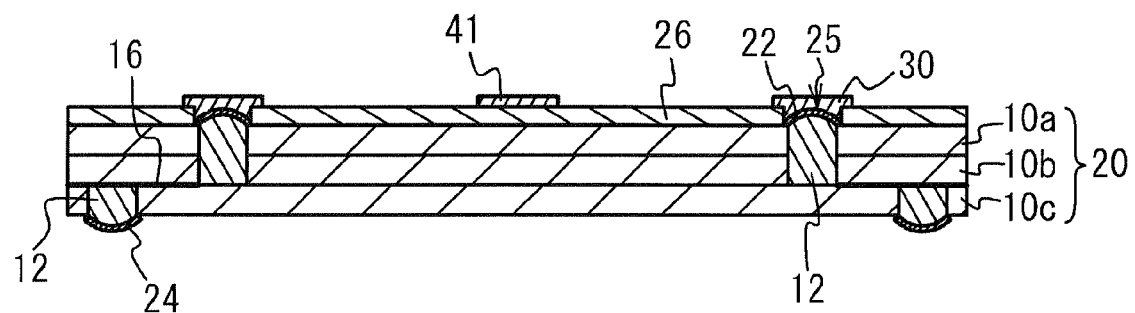

As illustrated in FIG. 8A, a metal layer 30 is formed on the photosensitive SOG oxide layer 26. The metal layer 30 is, for example, made of a Ti layer having thickness of 20 nm, an Au layer having thickness of 1000 nm, and a Ti layer having thickness of 20 nm. A Cu layer may be used instead of the Au layer. The metal layer 30 may be made of Ti layer having thickness of 20 nm, a Cu layer having thickness of 800 nm, a Ti layer having thickness of 200 nm and an Au layer having thickness of 20 nm in order from lower side. It is preferable that the metal layer 30 includes an Al layer, an Au layer or a Cu layer as a main layer for the purpose of reducing electrical resistance. As illustrated in FIG. 8B, a given region of the metal layer 30 is removed with an ion milling method. This results in a formation of a lower electrode 41 from the metal layer 30.

Figure 9A:
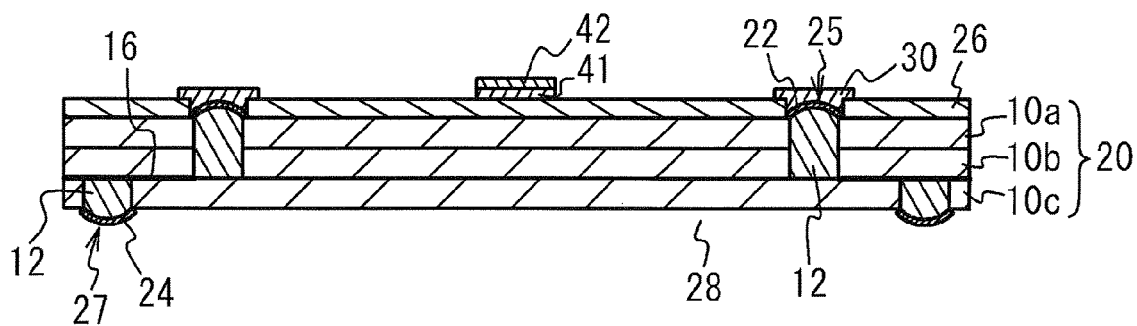
FIG. 9A through FIG. 9D illustrate a cross sectional view showing the method of manufacturing the integrated passive element in accordance with the first embodiment.

As illustrated in FIG. 9A, a dielectric layer 42 is formed on the lower electrode 41. The dielectric layer 42 is formed with a sputtering method, PECVD (Plasma Enhanced Chemical Vapor Deposition) or the like. The dielectric layer 42 may be $SiO_2$, $Si_3N_4$, $Al_2O_3$ or $Ta_2O_3$. Thickness of the dielectric layer 42 is, for example, 195 nm to 500 nm.

Figure 9B:
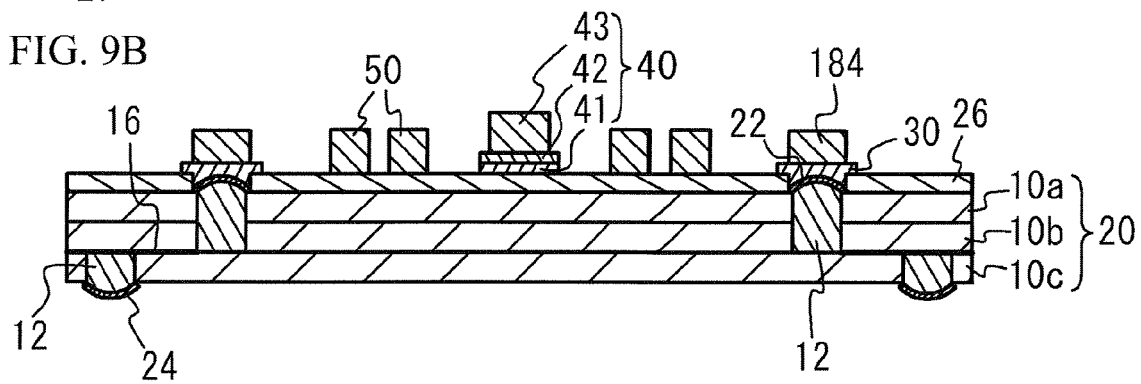

As illustrated in FIG. 9B, a seed layer is formed on the photosensitive SOG oxide layer 26 and the metal layer 30. The seed layer is, for example, made of a Ti layer having thickness of 50 nm and an Au layer having thickness of 200 nm, or a Ti layer having thickness of 50 nm and a Cu layer having thickness of 200 nm. A plated layer 184 made of Cu having thickness of 10 μm is formed on a given region of the seed layer with an electrolytic plating method. The seed layer is removed with use of the plated layer 184 as a mask. This results in a formation of an upper electrode 43 from the plated layer 184. A capacitor 40 is structured with the lower electrode 41, the dielectric layer 42 and the upper electrode 43. A coil of an inductor 50 is formed from the plated layer 184. A lower layer of a connection terminal is formed from the plated layer 184.

Figure 9C:
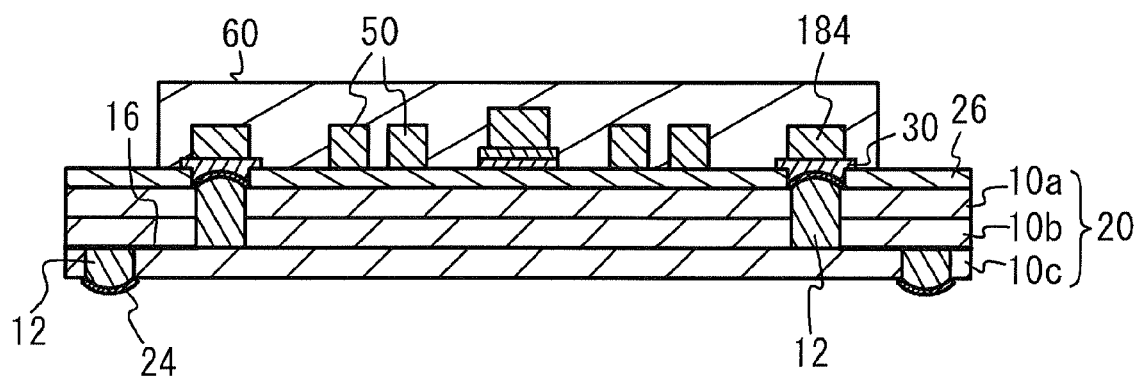

As illustrated in FIG. 9C, a low dielectric layer 60 is formed on the multi-layer ceramics substrate 20 so as to cover the plated layer 184. PBO, BCB or the like can be used as the low dielectric layer 60.

Figure 9D:
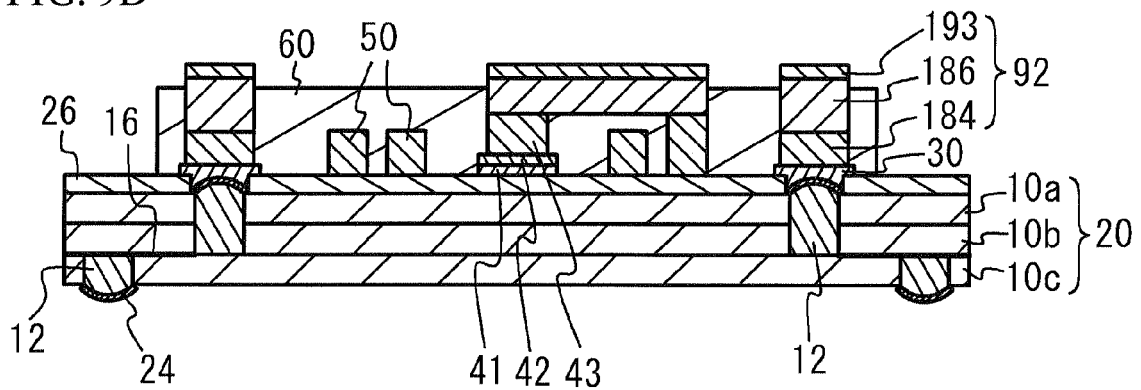

As illustrated in FIG. 9D, a given region of the low dielectric layer 60 is removed so that an upper face of the plated layer 184 where an upper plated layer is to be formed is exposed. A plated layer 186 made of Cu having thickness of 10 μm is formed in contact with the plated layer 184 with an electrolytic plating method. A seed layer is used when the plated layer 186 is formed, as in the case of FIG. 9A. The explanation of forming the seed layer is omitted. A pad layer 193 made of an Au layer and a Ni layer is formed on the plated layer 186. A connection terminal 92 made of the plated layers 184 and 186 and the pad layer 193 is formed on the penetrating electrode 12. With the processes, an integrated passive element including the multi-layer ceramics substrate 20 is manufactured.

Figure 10:
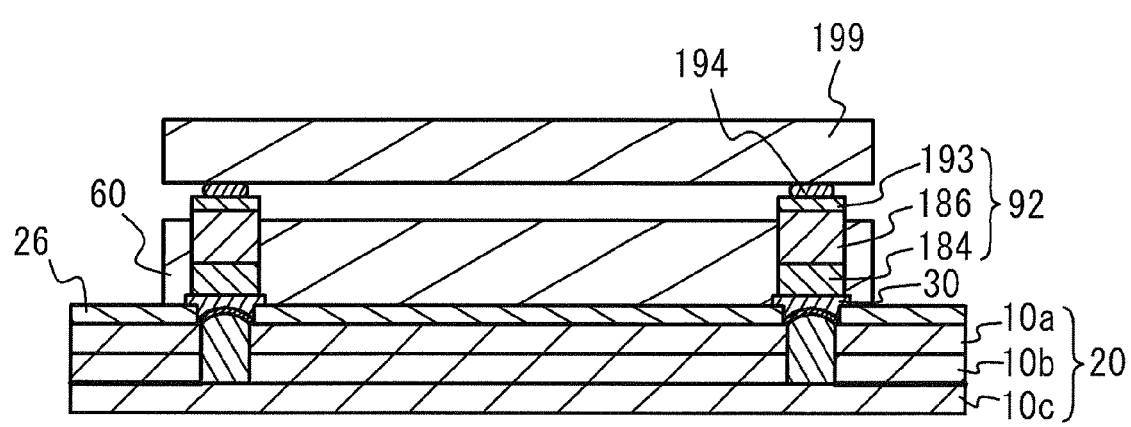
FIG. 10 illustrates a chip mounted on the integrated passive element in accordance with the first embodiment.

FIG. 10 illustrates a chip that is flip-chip mounted on the integrated passive element. FIG. 10 illustrates a cross sectional view different from FIG. 7A through FIG. 9D. A passive element such as a capacitor or an inductor is not illustrated. As illustrated in FIG. 10, a bump 194 made of a metal such as solder or Au is formed on the connection terminal 92. A chip 199, on which an electronic element such as a surface acoustic wave filter, an IC or the like is mounted, is flip-chip mounted on the connection terminal 92. With the processes, the electronic device in accordance with the first embodiment is manufactured.

In accordance with the first embodiment, the photosensitive SOG oxide layer 26 is formed on the multi-layer ceramics substrate 20, as illustrated in FIG. 7C. The opening 25 is formed in the photosensitive SOG oxide layer 26 so that the upper face of the penetrating electrode 12 is exposed, as illustrated in FIG. 7D. The inductor 50 and the capacitor 40 are coupled to the penetrating electrode 12 via the opening 25 of the photosensitive SOG oxide layer 26, as illustrated in FIG. 9D.

It is not necessary to form an opening with an etchant including fluorine or hydrogen fluoride if the photosensitive SOG oxide layer 26 is used. It is therefore possible to restrain dissolution of the multi-layer ceramics substrate 20 and the SOG oxide layer caused by the etchant including fluorine or hydrogen fluoride. It is preferable that the oxide layer is thick for the purpose of restraining dielectric loss of the passive element. It is preferable that the thickness of oxide layer is 0.5 μm or larger. It is possible to form the opening 25 easily in the thick oxide layer without the dissolution of the multi-layer ceramics substrate 20. A relative permittivity of the SOG oxide layer is approximately 2.5 to 4. A relative permittivity of the multi-layer ceramics substrate 20 is approximately 7 to 12. It is therefore possible to reduce the loss of the passive element.

The upper face of the multi-layer ceramics substrate 20 may dissolve because of the etchant used for the etching of the oxide layer when etching is performed in the forming process of the opening 25, if the multi-layer ceramics substrate 20 is made of metal oxide. It is therefore preferable that the photosensitive SOG oxide layer 26 is used as the oxide layer formed on the multi-layer ceramics substrate 20.

An inductor is affected by dielectric loss more, if the passive element is an inductor. It is effective that an oxide layer is formed on the multi-layer ceramics substrate 20, if the passive element is an inductor.

Figure 11:
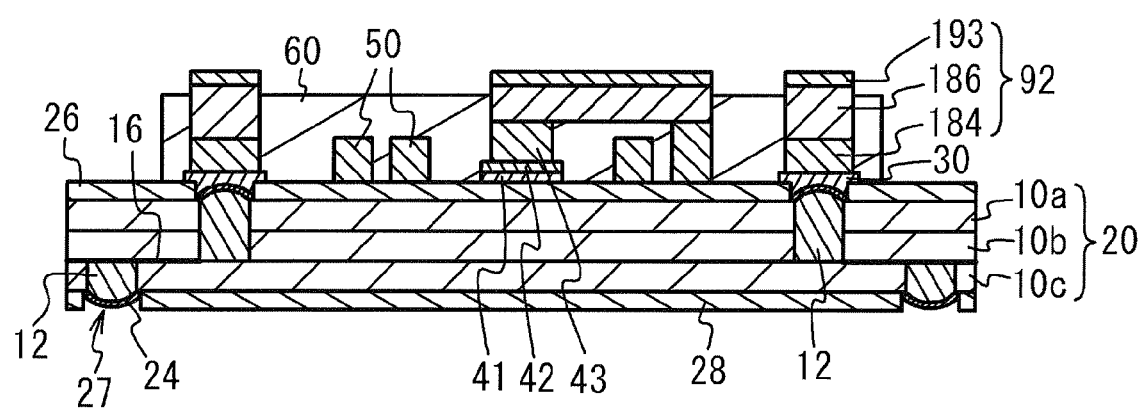
FIG. 11 illustrates a photosensitive SOG oxide layer on a lower face of a multi-layer ceramics substrate.

A photosensitive SOG oxide layer 28 may be formed on the lower face of the multi-layer ceramics substrate 20, and an opening 27 may be formed in the photosensitive SOG oxide layer 28 so that the lower face of the penetrating electrode 12 is exposed, as illustrated in FIG. 11. Unbalance of stress tends to be generated in the multi-layer ceramics substrate 20, because the multi-layer ceramics substrate 20 has a penetrating electrode 29 and the inner connection 16. The multi-layer ceramics substrate 20 may warp greatly, when the photosensitive SOG oxide layer 26 is formed on the multi-layer ceramics substrate 20 and the photosensitive SOG oxide layer 26 has thickness so that the dielectric loss of the passive element is restrained. As illustrated in FIG. 11, it is possible to compensate for stress caused by the photosensitive SOG oxide layers 26 and 28, if the photosensitive SOG oxide layer 26 is formed on the upper face of the multi-layer ceramics substrate 20 and the photosensitive SOG oxide layer 28 is formed on the lower face of the multi-layer ceramics substrate 20. It is therefore possible to restrain a warpage of the multi-layer ceramics substrate 20.

Second Embodiment

Figure 12:
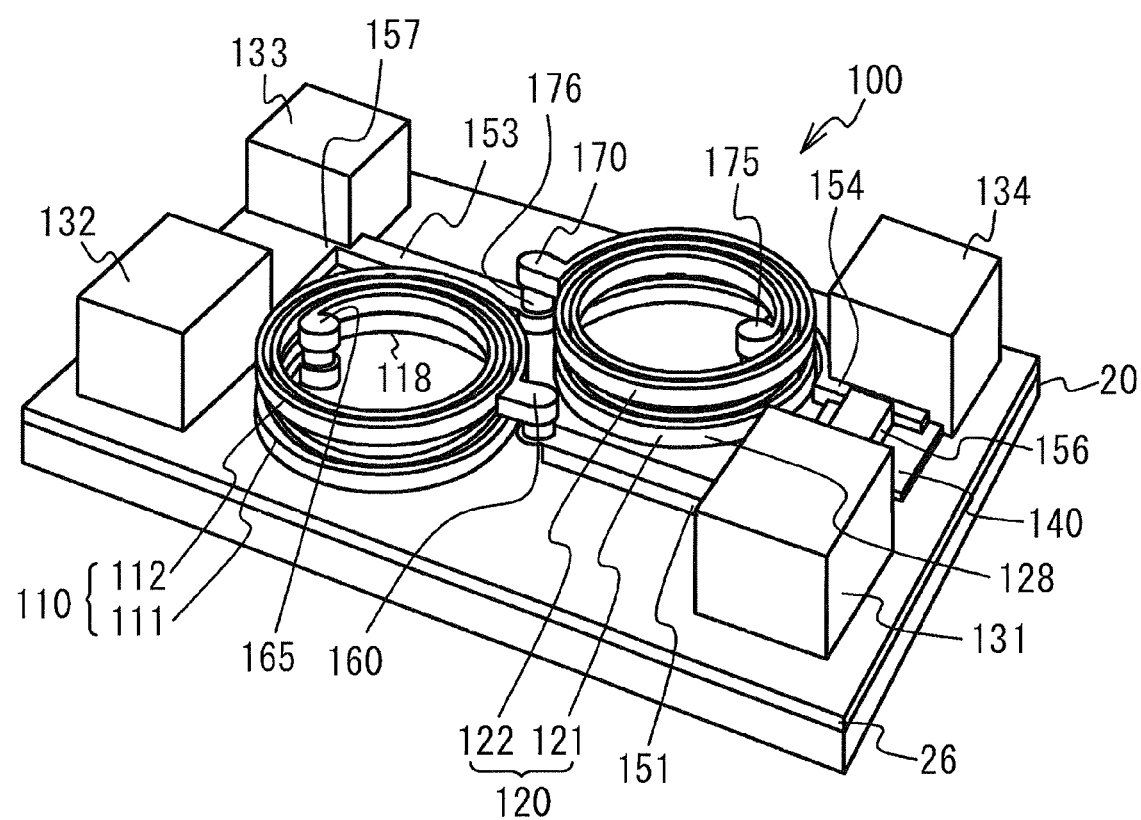
FIG. 12 illustrates a perspective view of the integrated passive element in accordance with the second embodiment.
Figure 13:
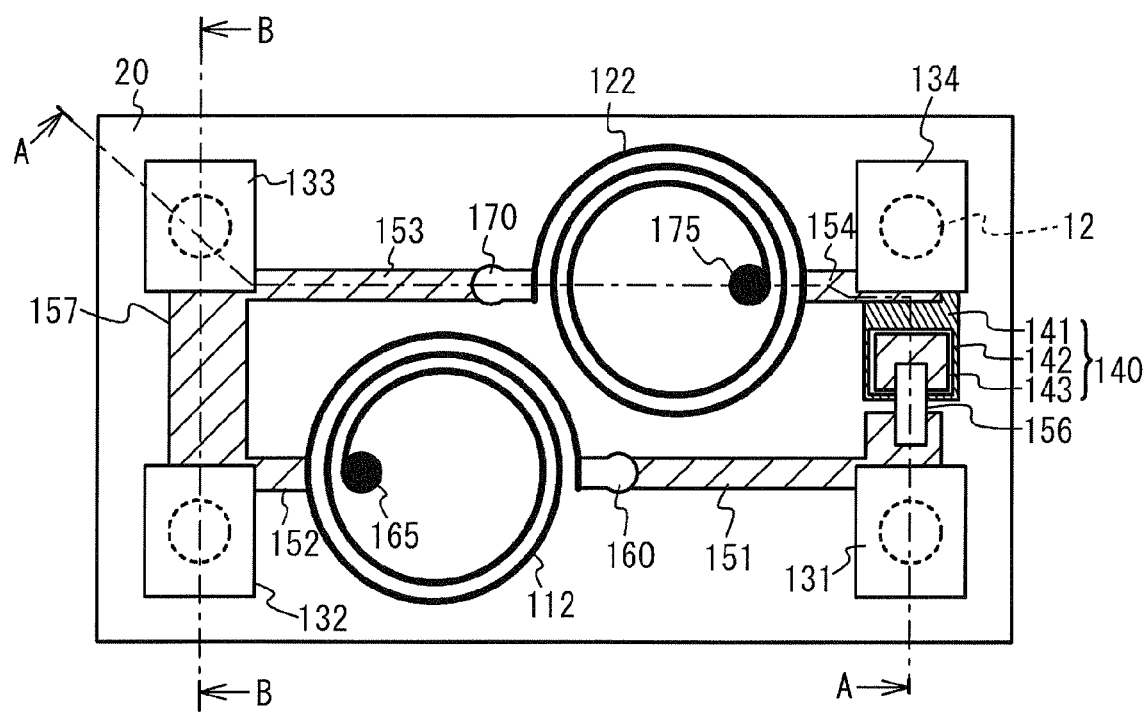
FIG. 13 illustrates a top view of the integrated passive element in accordance with the second embodiment.

A second embodiment is an example including an inductor having two coils that are stacked each other and are spaced from each other. FIG. 12 illustrates a perspective view of an integrated passive element in accordance with the second embodiment. FIG. 13 illustrates a top view of the integrated passive element. A coil 111 and a coil 121 are not illustrated. As illustrated in FIG. 12 and FIG. 13, an inductor 110 and an inductor 120 are formed on the photosensitive SOG oxide layer 26 on the multi-layer ceramics substrate 20. The inductor 110 is structured with the first coil 111 and the second coil 112. The inductor 120 is structured with a first coil 121 and a second coil 122. An inner end of the first coil 111 and an inner end of the second coil 112 (an end part of innermost circumference) are electrically coupled to each other via a connection portion 165. An outer end of the first coil 111 (an end part of outermost circumference) is connected to an interconnection 152. An outer end of the second coil 112 is electrically coupled to an interconnection 151 via a connection portion 160.

An inner end of the first coil 121 and an inner end of the second coil 122 are electrically coupled to each other via a connection portion 175. An outer end of the first coil 121 is connected to an interconnection 154. An outer end of the second coil 122 is coupled to an interconnection 153 via a connection portion 170. The interconnections 151 through 154 are formed on the photosensitive SOG oxide layer 26 on the multi-layer ceramics substrate 20, and are connected to connection terminals 131 through 134. The connection terminal 132 and the connection terminal 133 are coupled to each other via an interconnection 157. A capacitor 140 composed of a lower electrode 141, a dielectric layer 142 and an upper electrode 143 is connected between the connection terminal 131 and the terminal 134. The upper electrode 143 is coupled to the interconnection 151 via an interconnection 156. An integrated passive element 100 forms a π type L-C-L circuit between the connection terminal 131 and the connection terminal 134, when the connection terminal 131 acts as an input terminal, the connection terminal 134 acts as an output terminal, and the connection terminals 132 and 133 are grounded.

Next, a description will be given of a method of manufacturing the integrated passive element in accordance with the second embodiment with reference to FIG. 14A through FIG. 14D. FIG. 14A through FIG. 14D illustrate a schematic cross sectional view taken along a line A-A in FIG. 13. FIG. 14A through FIG. 14D illustrate a connection terminal 198 for strengthening mechanical connection between the chip and the multi-layer ceramics substrate. The connection terminal 198 is not illustrated in FIG. 12 and FIG. 13.

Figure 14A:
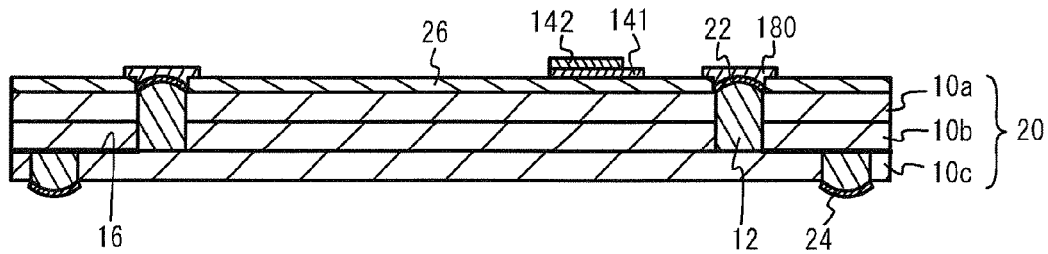
FIG. 14A through FIG. 14D illustrate a cross sectional view showing the method of manufacturing the integrated passive element in accordance with the second embodiment.

As illustrated in FIG. 14A, the processes illustrated in FIG. 1A through FIG. 8B in accordance with the first embodiment are performed. A metal layer 180 is illustrated instead of the metal layer 30. The lower electrode 141 of the capacitor is illustrated instead of the lower electrode 41. The dielectric layer 142 for the capacitor is formed, as in the case of FIG. 9A.

Figure 14B:
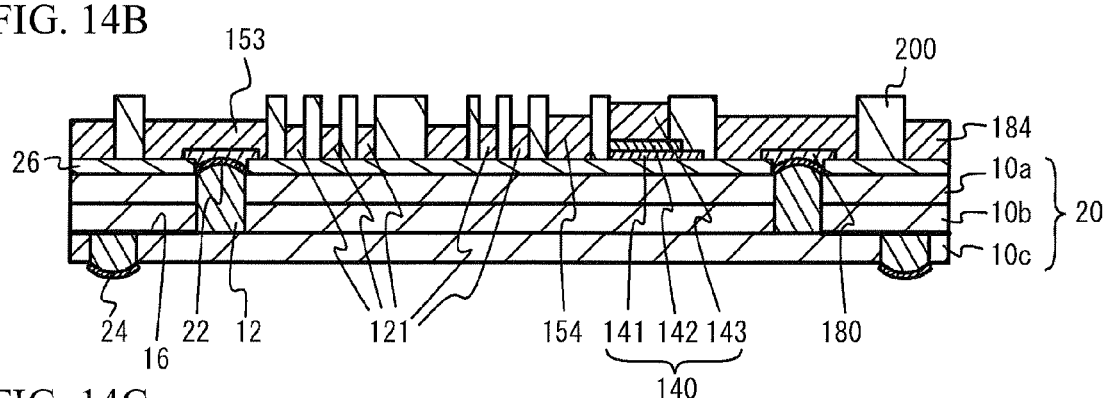

As illustrated in FIG. 14B, a seed layer for electrolytic plating is formed. A photo resist 200 having an opening for plating is formed. The opening is subjected to electrolytic plating. This results in a formation of the plated layer 184 made of Cu having thickness of 10 μm. This results in a formation of the first coil 121 the upper electrode 143, the interconnections 153 and 154 and a lower portion of the connection terminal from the plated layer 184. The MIM capacitor 140 is structured with the lower electrode 141, the dielectric layer 142 and the upper electrode 143.

Figure 14C:
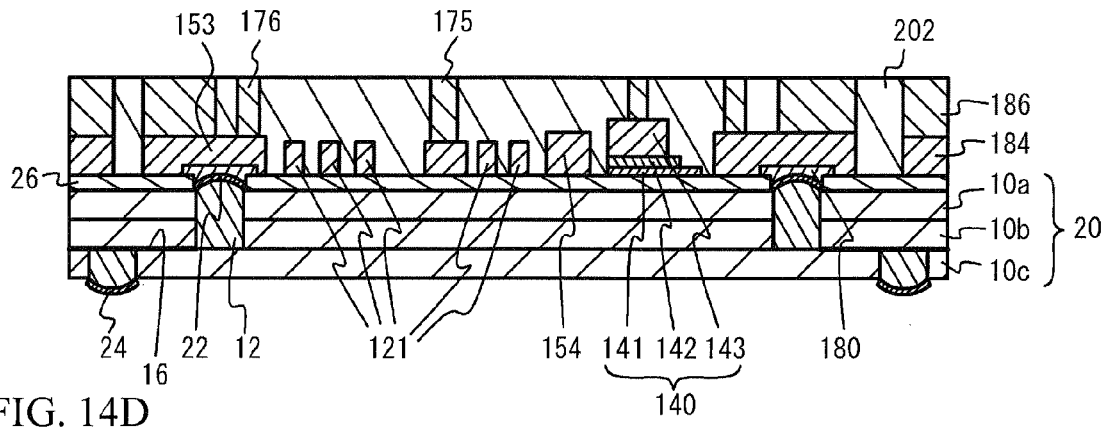

As illustrated in FIG. 14C, the photo resist 200 is removed. A photo resist 202 having an opening for plating is formed. The opening is subjected to electrolytic plating. And the plated layer 186 made of Cu having thickness of 10 μm is formed. This results in a formation of column portions 174 and 176 and an intermediate portion of the connection terminal from the plated layer 186.

Figure 14D:
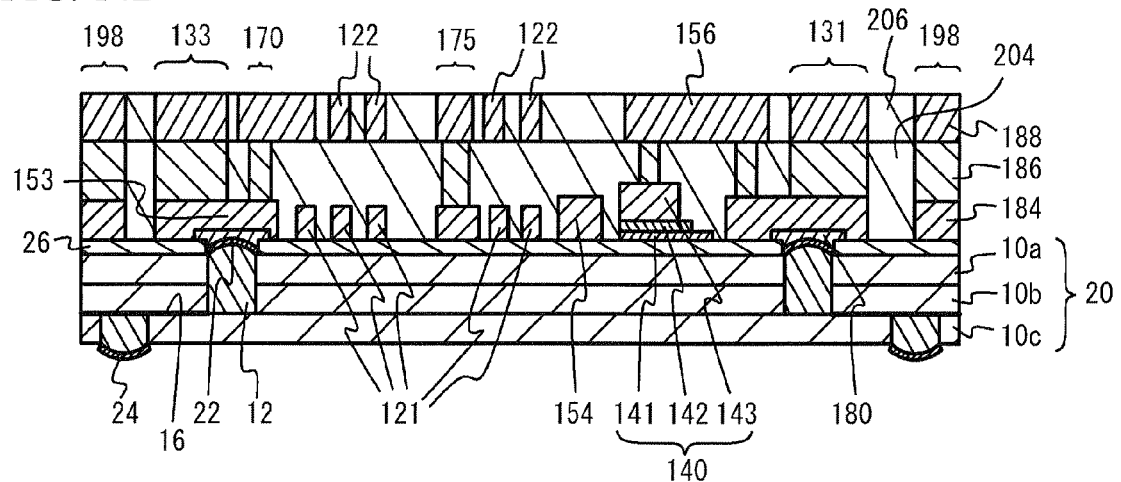

As illustrated in FIG. 14D, the photo resist 202 is removed. A sacrifice layer photo resist 204 is coated. An upper face of the sacrifice layer photo resist 204 is approximately on the same plane as the upper face of the column portions 174 and 176. A seed layer for electrolytic plating is formed on whole of the upper face of the sacrifice layer photo resist 204. A photo resist 206 having an opening for plating on the seed layer is formed. The opening is subjected to electrolytic plating. And a plated layer 188 made of Cu having thickness of 10 μm is formed. This results in a formation of the second coil 122, the interconnection 156 and an upper portion of a pad from the plated layer 188. The connection portion 170 and the connection portion 175 are formed from the plated layers 184, 186 and 188.

Figure 15A:
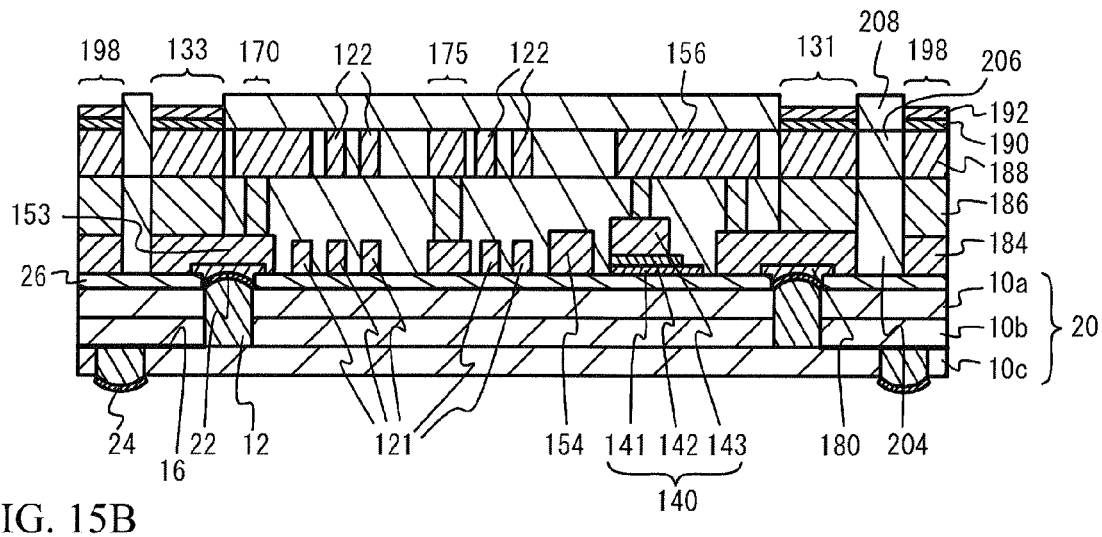
FIG. 15A through FIG. 15C illustrate a cross sectional view showing the method of manufacturing the integrated passive element in accordance with the second embodiment.
Figure 15B:
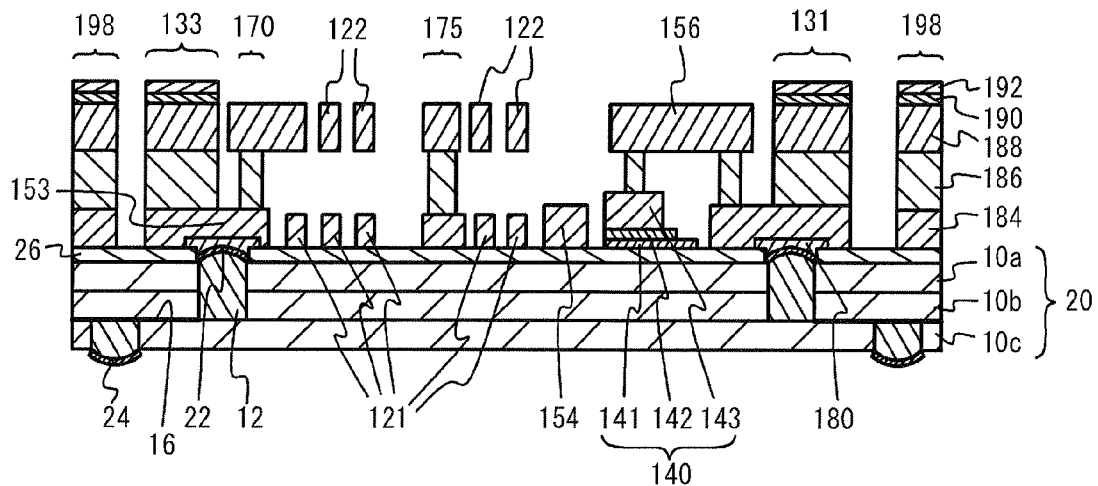

As illustrated in FIG. 15A, a photo resist 208 having an opening is formed. A Ni layer 190 and an Au layer 192 are formed on the plated layer 188. As illustrated in FIG. 15B, the photo resist 208, the seed layer, the photo resist 206 and the sacrifice layer photo resist 204 are removed. The connection terminals 131, 133 and 198 are formed from the metal layer 180, the plated layers 184, 186 and 188, the Ni layer 190 and the Au layer 192. With the processes, the integrated passive element in accordance with the second embodiment is formed.

Figure 15C:
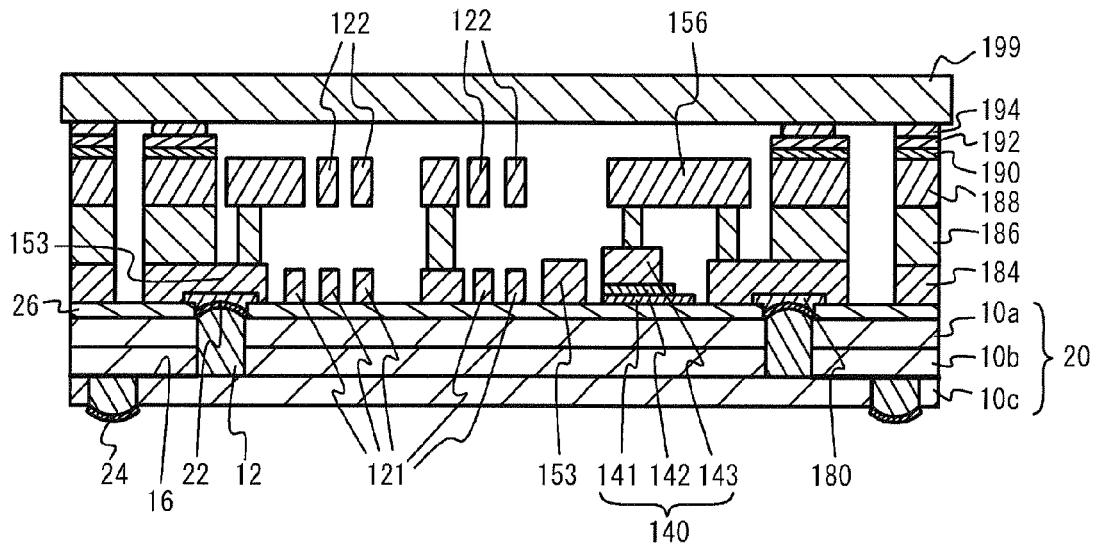

A description will be given of a mounting method of the chip 199 with reference to FIG. 15C. As illustrated in FIG. 15C, the chip 199 is flip-chip mounted on the connection terminals 131, 133 and 198 with use of the bump 194.

Figure 16:
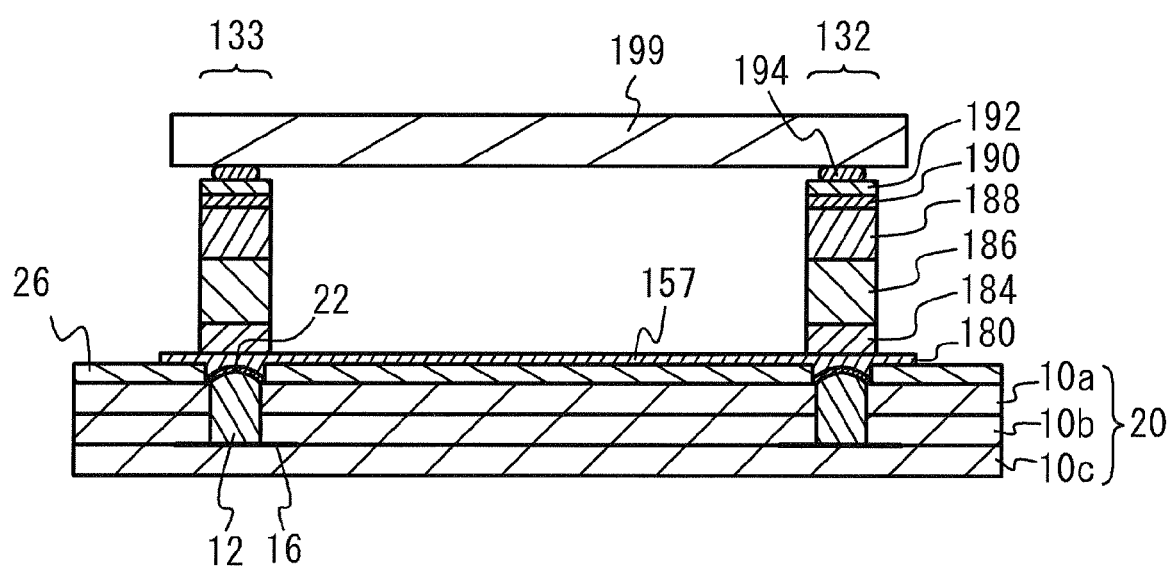
FIG. 16 illustrates a chip mounted on the integrated passive element in accordance with the second embodiment.

FIG. 16 illustrates a cross sectional view taken along a line B-B of FIG. 13 of the integrated passive element in accordance with the second embodiment where the chip 199 is flip-chip mounted. As illustrated in FIG. 16, the chip 199 is flip-chip mounted on the connection terminals 132 and 133.

The present invention may be implied to an integrated passive element having an inductor that has the spiral-shaped first coils 111 and 121 provided on the photosensitive SOG oxide layer 26 and the spiral-shaped second coils 112 and 122 spaced from and above the first coils 111 and 121.

The present invention is not limited to the specifically disclosed embodiments, but variations and modifications may be made without departing from the scope of the present invention.

The invention claimed is:

1. A method of manufacturing an electronic device comprising:
   forming a photosensitive SOG oxide layer on a multi-layer ceramics substrate made of metal oxide having a penetrating electrode, wherein a thickness of the photosensitive SOG oxide layer is approximately 0.5 μm or larger;
   forming an opening by subjecting the photosensitive SOG oxide layer to an exposure treatment and a developing treatment so that an upper face of the penetrating electrode is exposed and the diameter of the opening is larger than that of the penetrating electrode; and
   forming a passive element on the photosensitive SOG oxide layer, wherein the passive element is connected to the penetrating electrode through the opening and includes a spiral-shaped coil.

2. The method as claimed in claim 1, wherein the passive element is comprises the spiral shaped coil and a capacitor.

3. The method as claimed in claim 1, further comprising:
   forming another photosensitive SOG oxide layer on a lower face of the multi-layer ceramics substrate; and
   forming an opening in the another photosensitive SOG oxide layer so that a lower face of the penetrating electrode is exposed.

4. The method as claimed in claim 1, further comprising:
   forming a spiral-shaped first coil on the photosensitive SOG oxide layer; and
   forming a spiral-shaped second coil above the first coil across a space.

5. The method as claimed in claim 1, wherein a relative permittivity of the photosensitive SOG oxide layer is lower than that of the multi-layer ceramics substrate.

* * * * *

UNITED STATES PATENT AND TRADEMARK OFFICE
CERTIFICATE OF CORRECTION

| | |
|---|---|
| PATENT NO. | : 8,221,962 B2 |
| APPLICATION NO. | : 12/343935 |
| DATED | : July 17, 2012 |
| INVENTOR(S) | : Takahashi et al. |

It is certified that error appears in the above-identified patent and that said Letters Patent is hereby corrected as shown below:

On the Title Page:

Item (73), Assignee Information, please add a second Assignee's name and address as follows:

-- Fujitsu Limited, (Kawasaki, Japan) --

Signed and Sealed this
Sixteenth Day of October, 2012

David J. Kappos
*Director of the United States Patent and Trademark Office*